US009780449B2

(12) United States Patent
Schiller et al.

(10) Patent No.: US 9,780,449 B2
(45) Date of Patent: Oct. 3, 2017

(54) PHASE SHIFT BASED IMPROVED REFERENCE INPUT FREQUENCY SIGNAL INJECTION INTO A COUPLED VOLTAGE CONTROLLED OSCILLATOR (VCO) ARRAY DURING LOCAL OSCILLATOR (LO) SIGNAL GENERATION TO REDUCE A PHASE-STEERING REQUIREMENT DURING BEAMFORMING

(71) Applicant: Integrated Device Technology, Inc., San Jose, CA (US)

(72) Inventors: Christopher T. Schiller, Redding, CA (US); Jonathan Kennedy, Grass Valley, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 645 days.

(21) Appl. No.: 14/215,778

(22) Filed: Mar. 17, 2014

(65) Prior Publication Data
US 2014/0266891 A1 Sep. 18, 2014

Related U.S. Application Data

(60) Provisional application No. 61/799,335, filed on Mar. 15, 2013.

(51) Int. Cl.
*H01Q 3/42* (2006.01)
*H01Q 3/30* (2006.01)
(Continued)

(52) U.S. Cl.
CPC .............. *H01Q 3/42* (2013.01); *H01Q 3/30* (2013.01); *H03B 27/00* (2013.01)

(58) Field of Classification Search
CPC .. H01Q 3/26; H01Q 3/30; H01Q 3/34; H01Q 3/42; H01Q 3/22; H01Q 3/28; H01Q 3/40;
(Continued)

(56) References Cited

U.S. PATENT DOCUMENTS 2,087,767 A 7/1937 Schermer
2,349,976 A 5/1944 Matsudaira
(Continued)

FOREIGN PATENT DOCUMENTS

CA 2255347 A1 6/1999
CA 2340716 A1 3/2000
(Continued)

OTHER PUBLICATIONS

"An Analysis of Power Consumption in a Smartphone", NICTA, University of New South Wales, 2010 by Aaron Carroll, (pp. 14) https://www.usenix.org/legacy/event/usenix10/tech/full_papers/Carroll.pdf.
(Continued)

*Primary Examiner* — Bernarr Gregory
(74) *Attorney, Agent, or Firm* — Haynes and Boone, LLP

(57) ABSTRACT

A method includes injecting a reference input signal into each Voltage Controlled Oscillator (VCO) of a number of VCOs forming a coupled VCO array to reduce a level of injection energy required therefor. The reference input signal is configured to control operating frequency of the coupled VCO array. The method also includes utilizing a phase shift circuit: between individual VCOs of the coupled VCO array and/or in a path of injection of the reference input signal into one or more VCO(s) of the individual VCOs, and mixing outputs of the number of VCOs with signals from antenna elements of an antenna array to introduce differential phase shifts in signal paths coupled to the antenna elements during
(Continued)

performing beamforming with the antenna array. Further, the method includes reducing a phase-steering requirement of the coupled VCO array during the beamforming based on the utilization of the phase shift circuit.

20 Claims, 6 Drawing Sheets

(51) Int. Cl.
*H03B 27/00* (2006.01)
*H01Q 3/00* (2006.01)

(58) Field of Classification Search
CPC .......... H03B 5/08; H03B 5/12; H03B 5/1203;
H03B 5/30; H03B 5/32; H03B 5/326;
H03B 27/00; H03L 7/00; H03L 7/06;
H03L 7/16; H03L 7/18; H03L 7/22; G06F
1/04; G06F 1/08; H04B 7/00
USPC .................................................... 331/46–57
See application file for complete search history.

(56) References Cited

U.S. PATENT DOCUMENTS

| | | | |
|---|---|---|---|
| 2,810,906 A | 10/1957 | Lynch | |
| 2,904,674 A | 9/1959 | Crawford | |
| 3,036,211 A | 5/1962 | Broadhead, Jr. et al. | |
| 3,193,767 A | 7/1965 | Schultz | |
| 3,305,864 A | 2/1967 | Ghose | |
| 3,328,714 A | 6/1967 | Hugenholtz | |
| 3,344,355 A | 9/1967 | Massman | |
| 3,422,436 A | 1/1969 | Marston | |
| 3,422,437 A | 1/1969 | Marston | |
| 3,433,960 A | 3/1969 | Minott | |
| 3,460,145 A | 8/1969 | Johnson | |
| 3,500,411 A | 3/1970 | Kiesling | |
| 3,619,786 A | 11/1971 | Wilcox | |
| 3,680,112 A | 7/1972 | Thomas | |
| 3,754,257 A | 8/1973 | Coleman | |
| 3,803,618 A | 4/1974 | Coleman | |
| 3,832,713 A * | 8/1974 | Rubin ................... | H01Q 3/42 331/17 |
| 3,838,423 A | 9/1974 | Di Matteo | |
| 3,996,592 A | 12/1976 | Kline et al. | |
| 4,001,691 A | 1/1977 | Gruenberg | |
| 4,017,867 A | 4/1977 | Claus | |
| 4,032,922 A | 6/1977 | Provencher | |
| 4,090,199 A | 5/1978 | Archer | |
| 4,112,430 A | 9/1978 | Ladstatter | |
| 4,148,031 A | 4/1979 | Fletcher et al. | |
| 4,188,578 A | 2/1980 | Reudink et al. | |
| 4,189,733 A | 2/1980 | Malm | |
| 4,214,244 A | 7/1980 | McKay et al. | |
| 4,233,606 A | 11/1980 | Lovelace et al. | |
| 4,270,222 A | 5/1981 | Menant | |
| 4,277,787 A | 7/1981 | King | |
| 4,315,262 A | 2/1982 | Acampora et al. | |
| 4,404,563 A | 9/1983 | Richardson | |
| 4,532,519 A | 7/1985 | Rudish et al. | |
| 4,544,927 A | 10/1985 | Kurth et al. | |
| 4,566,013 A | 1/1986 | Steinberg et al. | |
| 4,649,373 A | 3/1987 | Bland et al. | |
| 4,688,045 A | 8/1987 | Knudsen | |
| 4,698,748 A | 10/1987 | Juzswik et al. | |
| 4,722,083 A | 1/1988 | Tirro et al. | |
| 4,733,240 A * | 3/1988 | Bradley ................... | H01Q 3/42 327/147 |
| 4,736,463 A | 4/1988 | Chavez | |
| 4,743,783 A | 5/1988 | Isbell et al. | |
| 4,772,893 A | 9/1988 | Iwasaki | |
| 4,792,991 A | 12/1988 | Eness | |
| 4,806,938 A | 2/1989 | Meadows | |
| 4,827,268 A | 5/1989 | Rosen | |
| 4,882,589 A | 11/1989 | Reisenfeld | |
| 4,901,085 A | 2/1990 | Spring et al. | |
| 4,956,643 A | 9/1990 | Hahn, III et al. | |
| 4,965,602 A | 10/1990 | Kahrilas et al. | |
| 5,001,776 A | 3/1991 | Clark | |
| 5,012,254 A | 4/1991 | Thompson | |
| 5,027,126 A | 6/1991 | Basehgi et al. | |
| 5,028,931 A | 7/1991 | Ward | |
| 5,034,752 A | 7/1991 | Pourailly et al. | |
| 5,041,836 A | 8/1991 | Paschen et al. | |
| 5,084,708 A | 1/1992 | Champeau et al. | |
| 5,093,668 A | 3/1992 | Sreenivas | |
| 5,107,273 A | 4/1992 | Roberts | |
| 5,128,687 A | 7/1992 | Fay | |
| 5,166,690 A | 11/1992 | Carlson et al. | |
| 5,173,701 A | 12/1992 | Dijkstra | |
| 5,179,724 A | 1/1993 | Lindoff | |
| 5,243,415 A | 9/1993 | Vance | |
| 5,274,836 A | 12/1993 | Lux | |
| 5,276,449 A | 1/1994 | Walsh | |
| 5,347,546 A | 9/1994 | Abadi et al. | |
| 5,349,688 A | 9/1994 | Nguyen | |
| 5,359,329 A | 10/1994 | Lewis et al. | |
| 5,369,771 A | 11/1994 | Gettel | |
| 5,375,146 A | 12/1994 | Chalmers | |
| 5,396,635 A | 3/1995 | Fung | |
| 5,408,668 A | 4/1995 | Tornai | |
| 5,434,578 A | 7/1995 | Stehlik | |
| 5,457,365 A | 10/1995 | Blagaila et al. | |
| 5,481,570 A | 1/1996 | Winters | |
| 5,486,726 A | 1/1996 | Kim et al. | |
| 5,497,162 A | 3/1996 | Kaiser | |
| 5,523,764 A * | 6/1996 | Martinez .................. | H01Q 3/22 342/372 |
| 5,539,415 A | 7/1996 | Metzen et al. | |
| 5,560,020 A | 9/1996 | Nakatani et al. | |
| 5,560,024 A | 9/1996 | Harper et al. | |
| 5,564,094 A | 10/1996 | Anderson et al. | |
| 5,583,511 A | 12/1996 | Hulderman | |
| 5,592,178 A | 1/1997 | Chang et al. | |
| 5,594,460 A | 1/1997 | Eguchi | |
| 5,617,572 A | 4/1997 | Pearce et al. | |
| 5,666,365 A | 9/1997 | Kostreski | |
| 5,697,081 A | 12/1997 | Lyall, Jr. et al. | |
| 5,710,929 A | 1/1998 | Fung | |
| 5,712,641 A | 1/1998 | Casabona et al. | |
| 5,748,048 A | 5/1998 | Moyal | |
| 5,754,138 A | 5/1998 | Turcotte et al. | |
| 5,787,294 A | 7/1998 | Evoy | |
| 5,790,070 A | 8/1998 | Natarajan et al. | |
| 5,799,199 A | 8/1998 | Ito et al. | |
| 5,822,597 A | 10/1998 | Kawano et al. | |
| 5,867,063 A | 2/1999 | Snider et al. | |
| 5,869,970 A | 2/1999 | Palm et al. | |
| 5,870,685 A | 2/1999 | Flynn | |
| 5,909,460 A | 6/1999 | Dent | |
| 5,952,965 A | 9/1999 | Kowalski | |
| 5,959,578 A | 9/1999 | Kreutel, Jr. | |
| 5,966,371 A | 10/1999 | Sherman | |
| 5,987,614 A | 11/1999 | Mitchell et al. | |
| 6,006,336 A | 12/1999 | Watts, Jr. et al. | |
| 6,009,124 A | 12/1999 | Smith et al. | |
| 6,026,285 A | 2/2000 | Lyall, Jr. et al. | |
| 6,061,385 A | 5/2000 | Ostman | |
| 6,079,025 A | 6/2000 | Fung | |
| 6,084,540 A | 7/2000 | Yu | |
| 6,111,816 A | 8/2000 | Chiang et al. | |
| 6,127,815 A | 10/2000 | Wilcox | |
| 6,127,971 A | 10/2000 | Calderbank et al. | |
| 6,144,705 A | 11/2000 | Papadopoulos et al. | |
| 6,166,689 A | 12/2000 | Dickey, Jr. et al. | |
| 6,167,286 A | 12/2000 | Ward et al. | |
| 6,169,522 B1 | 1/2001 | Ma et al. | |
| 6,175,719 B1 | 1/2001 | Sarraf et al. | |
| 6,272,317 B1 | 8/2001 | Houston et al. | |
| 6,298,221 B1 | 10/2001 | Nguyen | |
| 6,317,411 B1 | 11/2001 | Whinnett et al. | |
| 6,320,896 B1 | 11/2001 | Jovanovich et al. | |
| 6,336,030 B2 | 1/2002 | Houston | |

(56) References Cited

U.S. PATENT DOCUMENTS

| | | | |
|---|---|---|---|
| 6,397,090 B1 | 5/2002 | Cho | |
| 6,463,295 B1 | 10/2002 | Yun | |
| 6,473,016 B2 | 10/2002 | Piirainen et al. | |
| 6,473,037 B2 | 10/2002 | Vail et al. | |
| 6,480,522 B1 | 11/2002 | Hoole et al. | |
| 6,492,877 B1* | 12/2002 | Chan | H03B 27/00 331/46 |
| 6,501,415 B1 | 12/2002 | Viana et al. | |
| 6,509,865 B2 | 1/2003 | Takai | |
| 6,512,801 B1* | 1/2003 | Ninomiya | H03B 5/326 331/1 R |
| 6,523,123 B1 | 2/2003 | Barbee | |
| 6,529,162 B2 | 3/2003 | Newberg et al. | |
| 6,587,077 B2 | 7/2003 | Vail et al. | |
| 6,598,009 B2 | 7/2003 | Yang | |
| 6,630,905 B1 | 10/2003 | Newberg et al. | |
| 6,646,599 B1 | 11/2003 | Apa et al. | |
| 6,653,969 B1 | 11/2003 | Birleson | |
| 6,661,366 B2 | 12/2003 | Yu | |
| 6,661,375 B2 | 12/2003 | Rickett et al. | |
| 6,671,227 B2 | 12/2003 | Gilbert et al. | |
| 6,697,953 B1 | 2/2004 | Collins | |
| 6,707,419 B2 | 3/2004 | Woodington et al. | |
| 6,768,456 B1 | 7/2004 | Lalezari et al. | |
| 6,771,220 B1 | 8/2004 | Ashe et al. | |
| 6,778,137 B2 | 8/2004 | Krikorian et al. | |
| 6,788,250 B2 | 9/2004 | Howell | |
| 6,816,977 B2 | 11/2004 | Brakmo et al. | |
| 6,822,522 B1 | 11/2004 | Brown et al. | |
| 6,833,766 B2 | 12/2004 | Kim et al. | |
| 6,870,503 B2 | 3/2005 | Mohamadi | |
| 6,873,289 B2 | 3/2005 | Kwon et al. | |
| 6,885,974 B2 | 4/2005 | Holle | |
| 6,947,775 B2 | 9/2005 | Okamoto et al. | |
| 6,960,962 B2 | 11/2005 | Peterzell et al. | |
| 6,977,610 B2 | 12/2005 | Brookner et al. | |
| 6,980,786 B1 | 12/2005 | Groe | |
| 6,982,670 B2* | 1/2006 | Mohamadi | H01Q 3/22 342/372 |
| 6,989,787 B2 | 1/2006 | Park et al. | |
| 6,992,992 B1 | 1/2006 | Cooper et al. | |
| 7,006,039 B2 | 2/2006 | Miyamoto et al. | |
| 7,010,330 B1 | 3/2006 | Tsividis | |
| 7,013,165 B2 | 3/2006 | Yoon et al. | |
| 7,016,654 B1 | 3/2006 | Bugeja | |
| 7,035,613 B2 | 4/2006 | Dubash et al. | |
| 7,039,442 B1 | 5/2006 | Joham et al. | |
| 7,062,302 B2 | 6/2006 | Yamaoka | |
| 7,103,383 B2 | 9/2006 | Ito | |
| 7,109,918 B1 | 9/2006 | Meadows et al. | |
| 7,109,919 B2 | 9/2006 | Howell | |
| 7,110,732 B2 | 9/2006 | Mostafa et al. | |
| 7,126,542 B2 | 10/2006 | Mohamadi | |
| 7,126,554 B2 | 10/2006 | Mohamadi | |
| 7,154,346 B2 | 12/2006 | Jaffe et al. | |
| 7,196,590 B1 | 3/2007 | In et al. | |
| 7,245,269 B2 | 7/2007 | Sievenpiper et al. | |
| 7,248,128 B2* | 7/2007 | Mattila | H03L 7/00 331/107 P |
| 7,304,607 B2 | 12/2007 | Miyamoto et al. | |
| 7,312,750 B2 | 12/2007 | Mao et al. | |
| 7,327,313 B2 | 2/2008 | Hemmi et al. | |
| 7,340,623 B2 | 3/2008 | Kato et al. | |
| 7,342,465 B2* | 3/2008 | Seefeldt | H03L 7/18 331/17 |
| 7,379,515 B2 | 5/2008 | Johnson et al. | |
| 7,382,202 B2 | 6/2008 | Jaffe et al. | |
| 7,382,314 B2 | 6/2008 | Liao et al. | |
| 7,382,743 B1 | 6/2008 | Rao et al. | |
| 7,394,325 B2* | 7/2008 | Ueno | H03B 27/00 331/57 |
| 7,421,591 B2 | 9/2008 | Sultenfuss et al. | |
| 7,427,901 B2* | 9/2008 | Matsumoto | H03L 7/00 331/2 |
| 7,440,766 B1 | 10/2008 | Tuovinen et al. | |
| 7,463,191 B2 | 12/2008 | Dybdal et al. | |
| 7,482,975 B2 | 1/2009 | Kimata | |
| 7,501,959 B2 | 3/2009 | Shirakawa | |
| 7,508,950 B2 | 3/2009 | Danielsen | |
| 7,522,885 B2 | 4/2009 | Parssinen et al. | |
| 7,529,443 B2 | 5/2009 | Holmstrom et al. | |
| 7,538,624 B2* | 5/2009 | Numata | H03B 5/1203 331/108 R |
| 7,548,120 B2* | 6/2009 | Lam | G06F 1/08 331/179 |
| 7,558,548 B2 | 7/2009 | Konchistky | |
| 7,570,124 B2 | 8/2009 | Haralabidis et al. | |
| 7,574,617 B2 | 8/2009 | Park | |
| 7,620,382 B2 | 11/2009 | Yamamoto | |
| 7,663,546 B1 | 2/2010 | Miyamoto et al. | |
| 7,664,196 B2* | 2/2010 | Adlerstein | H01Q 3/30 375/267 |
| 7,664,533 B2 | 2/2010 | Logothetis et al. | |
| 7,710,319 B2 | 5/2010 | Nassiri-Toussi et al. | |
| 7,728,769 B2 | 6/2010 | Chang et al. | |
| 7,742,000 B2 | 6/2010 | Mohamadi | |
| 7,747,237 B2* | 6/2010 | Ali | H03L 7/22 331/2 |
| 7,760,122 B1 | 7/2010 | Zortea | |
| 7,812,775 B2 | 10/2010 | Babakhani et al. | |
| 7,848,719 B2* | 12/2010 | Krishnaswamy | H01Q 3/28 327/105 |
| 7,861,098 B2 | 12/2010 | Theocharous et al. | |
| 7,912,517 B2 | 3/2011 | Park | |
| 7,925,208 B2 | 4/2011 | Sarraf et al. | |
| 7,934,107 B2 | 4/2011 | Walrath | |
| 7,944,396 B2 | 5/2011 | Brown et al. | |
| 7,979,049 B2 | 7/2011 | Oredsson et al. | |
| 7,982,651 B1 | 7/2011 | Zortea | |
| 7,982,669 B2 | 7/2011 | Nassiri-Toussi et al. | |
| 7,991,437 B2 | 8/2011 | Camuffo et al. | |
| 8,005,437 B2 | 8/2011 | Rofougaran | |
| 8,031,019 B2 | 10/2011 | Chawla et al. | |
| 8,036,164 B1 | 10/2011 | Winters et al. | |
| 8,036,719 B2 | 10/2011 | Ying | |
| 8,063,996 B2 | 11/2011 | Du Val et al. | |
| 8,072,380 B2 | 12/2011 | Crouch | |
| 8,078,110 B2 | 12/2011 | Li et al. | |
| 8,102,313 B2 | 1/2012 | Guenther et al. | |
| 8,112,646 B2 | 2/2012 | Tsai | |
| 8,126,417 B2 | 2/2012 | Saito | |
| 8,138,841 B2 | 3/2012 | Wan et al. | |
| 8,156,353 B2 | 4/2012 | Tsai | |
| 8,165,185 B2 | 4/2012 | Zhang et al. | |
| 8,165,543 B2 | 4/2012 | Rohit et al. | |
| 8,170,503 B2 | 5/2012 | Oh et al. | |
| 8,174,328 B2 | 5/2012 | Park et al. | |
| 8,184,052 B1 | 5/2012 | Wu et al. | |
| 8,222,933 B2 | 7/2012 | Nagaraj | |
| 8,248,203 B2 | 8/2012 | Hanwright et al. | |
| 8,265,646 B2 | 9/2012 | Agarwal | |
| 8,290,020 B2 | 10/2012 | Liu et al. | |
| 8,305,190 B2 | 11/2012 | Moshfeghi | |
| 8,325,089 B2 | 12/2012 | Rofougaran | |
| 8,340,015 B1 | 12/2012 | Miller et al. | |
| 8,344,943 B2 | 1/2013 | Brown et al. | |
| 8,373,510 B2 | 2/2013 | Kelkar | |
| 8,396,107 B2 | 3/2013 | Gaur | |
| 8,400,356 B2 | 3/2013 | Paynter | |
| 8,417,191 B2 | 4/2013 | Xia et al. | |
| 8,428,535 B1 | 4/2013 | Cousinard et al. | |
| 8,432,805 B2 | 4/2013 | Agarwal | |
| 8,446,317 B1 | 5/2013 | Wu et al. | |
| 8,456,244 B2 | 6/2013 | Obkircher et al. | |
| 8,466,776 B2 | 6/2013 | Fink et al. | |
| 8,466,832 B2 | 6/2013 | Afshari et al. | |
| 8,472,884 B2 | 6/2013 | Ginsburg et al. | |
| 8,509,144 B2 | 8/2013 | Miller et al. | |
| 8,537,051 B1* | 9/2013 | Rudish | H01Q 3/42 342/375 |
| 8,542,629 B2 | 9/2013 | Miller | |
| 8,558,625 B1 | 10/2013 | Lie et al. | |
| 8,565,358 B2 | 10/2013 | Komaili et al. | |

(56) References Cited

U.S. PATENT DOCUMENTS

| | | | |
|---|---|---|---|
| 8,571,127 B2 | 10/2013 | Jiang et al. |
| 8,604,976 B1 | 12/2013 | Chang et al. |
| 8,644,780 B2 | 2/2014 | Tohoku |
| 8,654,262 B2 | 2/2014 | Du Val et al. |
| 8,660,497 B1 | 2/2014 | Zhang et al. |
| 8,660,500 B2 | 2/2014 | Rofougaran et al. |
| 8,700,923 B2 | 4/2014 | Fung |
| 8,761,755 B2 | 6/2014 | Karaoguz |
| 8,762,751 B2 | 6/2014 | Rodriguez et al. |
| 8,781,426 B2 | 7/2014 | Ciccarelli et al. |
| 8,786,376 B2 | 7/2014 | Voinigescu et al. |
| 8,788,103 B2 | 7/2014 | Warren |
| 8,792,896 B2 | 7/2014 | Ahmad et al. |
| 8,797,212 B1 | 8/2014 | Wu et al. |
| 8,805,275 B2 | 8/2014 | O'Neill et al. |
| 8,832,468 B2 | 9/2014 | Pop et al. |
| 8,843,094 B2 | 9/2014 | Ahmed et al. |
| 8,914,068 B2 * | 12/2014 | Hayashi ............ H01Q 3/42 455/103 |
| 9,048,544 B2 * | 6/2015 | Georgiadis ......... H01Q 3/42 |
| 9,184,498 B2 * | 11/2015 | Schiller ............ H01Q 3/40 |
| 2001/0038318 A1 | 11/2001 | Johnson et al. |
| 2002/0084934 A1 | 7/2002 | Vail et al. |
| 2002/0159403 A1 | 10/2002 | Reddy |
| 2002/0175859 A1 | 11/2002 | Newberg et al. |
| 2002/0177475 A1 | 11/2002 | Park |
| 2002/0180639 A1 | 12/2002 | Rickett et al. |
| 2003/0003887 A1 | 1/2003 | Lim et al. |
| 2003/0034916 A1 | 2/2003 | Kwon et al. |
| 2004/0043745 A1 | 3/2004 | Najarian et al. |
| 2004/0095287 A1 | 5/2004 | Mohamadi |
| 2004/0166801 A1 | 8/2004 | Sharon et al. |
| 2004/0192376 A1 | 9/2004 | Grybos |
| 2004/0263408 A1 | 12/2004 | Sievenpiper et al. |
| 2005/0012667 A1 | 1/2005 | Noujeim |
| 2005/0030226 A1 | 2/2005 | Miyamoto et al. |
| 2005/0116864 A1 | 6/2005 | Mohamadi |
| 2005/0117720 A1 | 6/2005 | Goodman et al. |
| 2005/0197060 A1 | 9/2005 | Hedinger et al. |
| 2005/0206564 A1 | 9/2005 | Mao et al. |
| 2005/0208919 A1 | 9/2005 | Walker et al. |
| 2005/0215274 A1 | 9/2005 | Matson et al. |
| 2006/0003722 A1 | 1/2006 | Tuttle et al. |
| 2006/0063490 A1 | 3/2006 | Bader et al. |
| 2006/0262013 A1 | 11/2006 | Shiroma et al. |
| 2006/0281430 A1 | 12/2006 | Yamamoto |
| 2007/0047669 A1 | 3/2007 | Mak et al. |
| 2007/0098320 A1 | 5/2007 | Holmstrom et al. |
| 2007/0099588 A1 | 5/2007 | Konchistky |
| 2007/0123186 A1 | 5/2007 | Asayama et al. |
| 2007/0135051 A1 | 6/2007 | Zheng et al. |
| 2007/0142089 A1 | 6/2007 | Roy |
| 2007/0173286 A1 | 7/2007 | Carter et al. |
| 2007/0298742 A1 | 12/2007 | Ketchum et al. |
| 2008/0001812 A1 | 1/2008 | Jalali |
| 2008/0039042 A1 | 2/2008 | Ciccarelli et al. |
| 2008/0045153 A1 | 2/2008 | Surineni et al. |
| 2008/0063012 A1 | 3/2008 | Nakao et al. |
| 2008/0075058 A1 | 3/2008 | Mundarath et al. |
| 2008/0091965 A1 | 4/2008 | Nychka et al. |
| 2008/0129393 A1 | 6/2008 | Rangan et al. |
| 2008/0218429 A1 | 9/2008 | Johnson et al. |
| 2008/0233865 A1 | 9/2008 | Malarky et al. |
| 2008/0240031 A1 | 10/2008 | Nassiri-Toussi et al. |
| 2009/0023384 A1 | 1/2009 | Miller |
| 2009/0143038 A1 | 6/2009 | Saito |
| 2009/0153253 A1 | 6/2009 | Mei |
| 2009/0160707 A1 | 6/2009 | Lakkis |
| 2009/0286482 A1 | 11/2009 | Gorokhov et al. |
| 2010/0100751 A1 | 4/2010 | Guo et al. |
| 2010/0259447 A1 | 10/2010 | Crouch |
| 2010/0302980 A1 | 12/2010 | Ji et al. |
| 2011/0084879 A1 | 4/2011 | Brown et al. |
| 2011/0095794 A1 | 4/2011 | Dubost et al. |
| 2011/0140746 A1 | 6/2011 | Park et al. |
| 2011/0188597 A1 | 8/2011 | Agee et al. |
| 2011/0221396 A1 | 9/2011 | Glauning |
| 2011/0235748 A1 | 9/2011 | Kenington |
| 2011/0273210 A1 | 11/2011 | Nagaraj |
| 2011/0285593 A1 | 11/2011 | Cavirani et al. |
| 2012/0004005 A1 | 1/2012 | Ahmed et al. |
| 2012/0013507 A1 | 1/2012 | Fusco |
| 2012/0026970 A1 | 2/2012 | Winters et al. |
| 2012/0092211 A1 | 4/2012 | Hampel et al. |
| 2012/0190378 A1 | 7/2012 | Han et al. |
| 2012/0200327 A1 | 8/2012 | Sreekiran et al. |
| 2012/0235716 A1 | 9/2012 | Dubost et al. |
| 2012/0235857 A1 | 9/2012 | Kim et al. |
| 2012/0280730 A1 | 11/2012 | Obkircher et al. |
| 2012/0284543 A1 | 11/2012 | Xian et al. |
| 2012/0319734 A1 | 12/2012 | Nagaraj et al. |
| 2013/0002472 A1 | 1/2013 | Crouch |
| 2013/0039348 A1 | 2/2013 | Hu et al. |
| 2013/0047017 A1 | 2/2013 | Lin et al. |
| 2013/0095873 A1 | 4/2013 | Soriaga et al. |
| 2013/0154695 A1 | 6/2013 | Abbasi et al. |
| 2013/0176171 A1 | 7/2013 | Webber et al. |
| 2013/0234889 A1 | 9/2013 | Hwang et al. |
| 2013/0241612 A1 | 9/2013 | Obkircher et al. |
| 2013/0322197 A1 | 12/2013 | Schiller et al. |
| 2013/0339764 A1 | 12/2013 | Lee et al. |
| 2014/0085011 A1 | 3/2014 | Choi et al. |
| 2014/0097986 A1 | 4/2014 | Xue et al. |
| 2014/0120845 A1 | 5/2014 | Laskar |
| 2014/0120848 A1 | 5/2014 | Laskar |
| 2014/0266471 A1 | 9/2014 | Zhu et al. |
| 2014/0266889 A1 | 9/2014 | Schiller |
| 2014/0266890 A1 | 9/2014 | Schiller et al. |
| 2014/0266891 A1 | 9/2014 | Schiller et al. |
| 2014/0266892 A1 | 9/2014 | Schiller |
| 2014/0266893 A1 | 9/2014 | Rasheed et al. |
| 2014/0266894 A1 | 9/2014 | Rasheed et al. |
| 2014/0273817 A1 | 9/2014 | Schiller |

FOREIGN PATENT DOCUMENTS

| | | |
|---|---|---|
| EP | 0305099 A2 | 3/1989 |
| EP | 0754355 B1 | 6/2000 |
| EP | 1047216 A2 | 10/2000 |
| EP | 1261064 A1 | 11/2002 |
| EP | 1267444 A2 | 12/2002 |
| EP | 1672468 A2 | 6/2006 |
| EP | 2003799 A1 | 12/2008 |
| EP | 2151924 A1 | 2/2010 |
| EP | 2456079 A2 | 5/2012 |
| WO | 8601057 A1 | 2/1986 |
| WO | 8706072 A1 | 10/1987 |
| WO | 9107024 A1 | 5/1991 |
| WO | 9414178 A1 | 6/1994 |
| WO | 9721284 A1 | 6/1997 |
| WO | 9832245 A1 | 7/1998 |
| WO | 9916221 A1 | 4/1999 |
| WO | 0051202 A1 | 8/2000 |
| WO | 0055986 A1 | 9/2000 |
| WO | 0074170 A2 | 12/2000 |
| WO | 0117065 A1 | 3/2001 |
| WO | 0198839 A2 | 12/2001 |
| WO | 03023438 A2 | 3/2003 |
| WO | 03038513 A2 | 5/2003 |
| WO | 03041283 A2 | 5/2003 |
| WO | 03079043 A2 | 9/2003 |
| WO | 2004021541 A1 | 3/2004 |
| WO | 2004082197 A2 | 9/2004 |
| WO | 2006133225 A2 | 12/2006 |
| WO | 2007130442 A2 | 11/2007 |
| WO | 2010024539 A2 | 3/2010 |
| WO | 2010073241 A2 | 7/2010 |
| WO | 2011008146 A1 | 1/2011 |
| WO | 2012033509 A1 | 3/2012 |
| WO | 2014057329 A2 | 4/2014 |

(56) References Cited

FOREIGN PATENT DOCUMENTS

| WO | 2014150615 A1 | 9/2014 |
|---|---|---|
| WO | 2014151933 A2 | 9/2014 |

OTHER PUBLICATIONS

"Wake on Wireless: An Event Driven Energy Saving Strategy for Battery Operated Devices", Massachusetts Institute of Technology Cambridge, 2002 by Eugene Shih et al. (pp. 12) http://research.microsoft.com/en-us/um/people/bahl/Papers/Pdf/mobicom02.pdf.
"Reducing Leaking Electricity to 1 Watt" National Laboratory, Berkeley, CA, Aug. 28, 1998 by Alan Meier et al. (pp. 10) http://standby.lbl.gov/pdf/42108.html.
"Monitoring in Industrial Systems Using Wireless Sensor Network With Dynamic Power Management", Dept. of Technol., Univ. Regional do Noroeste do Estado do Rio Grande do Sul (UNIJUI), Ijui, Brazil, Jul. 21, 2009 by F. Salvadori (p. 2) http://ieeexplore.ieee.org/xpl/login.jsp?tp=&arnumber=5169976 &url=http%3A%2F%2Fieeexplore.ieee.org%2Fxpls%.
6 "Reducing Power in High-performance Microprocessors", Intel Corporation,Santa Clara CA. 1998 by Vivek Tiwari et al. (p. 1) http://dl.acm.org/citation.cfm?id=277227.
"Distributed Transmit Beamforming:Challenges and Recent Progress", University of California at Santa Barbara, 2009 by Raghuraman Mudumbai et al. (pp. 9) http://spinlab.wpi.edu/pubs/Mudumbai_COMMAG_2009.pdf.
"Design and Simulation of a Low Cost Digital Beamforming (DBF) Receiver for Wireless Communication",International Journal of Innovative Technology and Exploring Engineering (IJITEE), vol. 2, Jan. 2 , 2013 by V.N Okorogu (pp. 8) http://www.ijitee.org/attachments/File/v2i2/B0351012213.pdf.
"Frequency multiplication techniques for Sub-harmonic injection locking of LC oscillators and Its application to phased-array architectures", Ottawa-Carleton Institute for Electrical and Computer Engineering, 2013 by Yasser Khairat Soliman (pp. 2) https://curve.carleton.ca/system/files/theses/27532.pdf.
"Active Integrated Antennas", Transactions on microwave theory and techniques, vol. 50, No. 3, Mar. 2002, by Kai Chang et al. (pp. 8) http://www.cco.caltech.edu/~mmic/reshpubindex/MURI/MURI03/York2.pdf.
"Low cost and compact active integrated antenna transceiver for system applications", Dept. of Electronics Engineers, Texas A&M University, College Station, Texas, USA, Oct. 1996 by R.A. Flynt et al. (p. 1) http://ieeexplore.ieee.org/xpl/login.jsp?tp=&arnumber=538955&url=http%3A%2F%2Fieeexplore.ieee.org%2Fxpls%2Fabs_all.jsp%3Farnumber%3D538955.
"Phased array and adaptive antenna transceivers in wireless sensor networks", Institute of Microsystem Technology—IMTEK, Albert-Ludwig-University, Freiburg, Germany, 2004 by Ruimin Huang et al. (pp. 1) http://ieeexplore.ieee.org/xpl/login.jsp?tp=&arnumber=1333329&url=http%3A%2F%2Fieeexplore.ieee.org%2Fxpls%2Fabs_all.jsp%3Farnumber%3D1333329.
"A mixed-signal sensor interface microinstrument", Sensors and Actuators A: Physical, Science Direct, vol. 91, Issue 3, Jul. 15, 2001 by Keith L. Kraver et al. (p. 2) http://www.sciencedirect.com/science/article/pii/S0924424701005969.
"On the Feasibility of Distributed Beamforming in Wireless Networks", IEEE transactions on wireless communications, vol. 6,No. 5, May 2007 by R. Mudumbai. (pp. 10) https://research.engineering.uiowa.edu/wrl/sites/research.engineering.uiowa.edu.wrl/files/attachments/TWICOM07_0.pdf.
"Smart antennas control circuits for automotive communications", Mar. 28, 2012, by David Cordeau et al. (pp. 10) https://hal.archives-ouvertes.fr/file/index/docid/683344/filename/Cordeau_Paillot.pdf.
"Adaptive Beam Steering of RLSA Antenna With RFID Technonlogy", Progress in Electromagnetics Research, vol. 108, Jul. 19, 2010 by M. F. Jamlos et al. (pp. 16) http://jpier.org/PIER/pier108/05.10071903.pdf.

"Adaptive power controllable retrodirective array system for wireless sensor server applications", IEEE Xplore, Deptartment of Electrical Engineering, University of California, Los Angeles, CA, USA Dec. 2005, by Lim et al. (p. 1) ieeexplore.ieee.org/xpl/login.jsp?tp=&arnumber=1550023&url=http%3A%2F%2Fieeexplore.ieee.org%2Fxpls%.
"Retrodirective arrays for wireless communications", Microwave Magzine, IEEE Xplore, vol. 3,Issue 1, Mar. 2002 by R.Y. Miyamoto et al. (p. 1) http://ieeexplore.ieee.org/xpl/login.jsp?tp=&arnumber=990692&url=http%3A%2F%2Fieeexplore.ieee.org%2Fxpls%2Fabs_all.jsp%3Farnumber%3D990692.
"An Active Integrated Retrodirective Transponder for Remote Information Retrieval-on-Demand", IEEE Transactions on Microwave Theory and Techniques, vol. 49, No. 9, Sep. 2001 by Ryan Y. Miyamoto et al. (pp. 5) http://www.mwlab.ee.ucla.edu/publications/2001c/mtt_trans/d.pdf.
"Ongoing retro directive Array Research at UCLA", The Institute of electrical Information and communication Engineers, 2003 by Kevin M.K.H. Leong et al. (pp. 6) http://www.ieice.org/~wpt/paper/SPS02-08.pdf.
"Digital communications using self-phased arrays", Jet Propulsion Lab., California Inst. of Technology, Pasadena, CA, USA, IEEE Xplore, vol. 49, Issue 4, Apr. 2001 by L.D. DiDomenico et al. (p. 1) https://goo.gl/AjeXkP.
"Large Active Retrodirective Arrays for Space Applications", NASA Technical Documents, Jan. 15, 1978 by R. C Chernoff (p. 1) https://archive.org/details/nasa_techdoc_19780013390.
"Beam Steering in Smart Antennas by Using Low Complex Adaptive Algorithms", International Journal of Research in Engineering and Technology, vol. 2, Issue: 10, Oct. 2013 by Amarnadh Poluri et al. (pp. 7) http://injret.org/Volumes/V02/I10/IJRET_110210085.pdf.
"Efficient Adaptive Beam Steering Using INLMS Algorithm for Smart Antenna", ECE Department, QIS College of Engineering and Technology, Ongole, India, Jul. 22, 2012 by E. Anji Naik et al. (pp. 5) http://www.irnetexplore.ac.in/IRNetExplore_Proceedings/Vijayawada/AEEE/AEEE_22ndJuly2012/AEEE_22ndJuly2012_doc/paper3.pdf.
"A Primer on Digital Beamforming", Mar. 26, 1998 by Toby Haynes (p. 15) http://www.spectrumsignal.com/publications/beamform_primer.pdf.
"Design of Beam Steering Antenna Array for RFID Reader Using Fully Controlled RF Switches", Progress in Electromagnetics Research Symposium, Cambridge, USA, Jul. 2-6, 2008 by D. Zhou et al. (pp. 6) http://www.ieice.org/~wpt/papers/SPS02-08.pdf.
"Electronically steerable passive array radiator antennas for low-cost analog adaptive beamforming", ATR Adaptive Commun. Res. Labs., Kyoto, Japan, IEEE Xplore, 2000 by T. Ohira et al. (p. 1) https://goo.gl/gCk4CK.
"Sector-mode beamforming of a 2.4-GHz electronically steerable passive array radiator antenna for a wireless ad hoc network", ATR Adaptive Commun. Res. Labs., Kyoto, Japan, IEEE Xplore, 2002 by Jun Cheng et al. (p. 1) http://ieeexplore.ieee.org/xpl/articleDetails.jsp?arnumber=1016265.
"Design of electronically steerable passive array radiator (ESPAR) antennas", ATR Adaptive Commun. Res. Lab., Kyoto, Japan, IEEE Xplore, 2000 by K. Gyoda et al. (p. 1) http://ieeexplore.ieee.org/xpl/articleDetails.jsp?arnumber=875370.
"An adaptive MAC protocol for wireless ad hoc community network (WACNet) using electronically steerable passive array radiator antenna", ATR Adaptive Commun. Res. Lab., Kyoto, Japan, IEEE Xplore, 2001 by S. Bandyopadhyay et al. (p. 1) https://goo.gl/CrenS8.
"A low complex adaptive algorithm for antenna beam steering", Dept. of Electron. & Communication Engineering, Narasaraopeta Eng. College, Narasaraopeta, India , IEEE Xplore, 2011 by M.Z.U. Rahman et al. (p. 1) https://goo.g/qZ45zP.
"Receiver Front-End Architectures—Analysis and Evaluation", Mar. 1, 2010 by Pedro Cruz et al. (p. 27) http://cdn.intechopen.com/pdfs-wm/9961.pdf.
"Analysis and design of injection-locked LC dividers for quadrature generation", Dipt. di Ingegneria dell''Informazione, University di

(56) References Cited

OTHER PUBLICATIONS

Modena e Reggio Emilia, Italy, Solid State Circuits, IEEE Xplore, vol. 39, Issue 9, Sep. 2004 by https://goo.gl/mOj6fb.
"An injection-locking scheme for precision quadrature generation", CeLight Inc., Iselin, NJ, USA, Solid -State Circuits, IEEE Xplore, vol. 37, Issue 7, Jul. 2002 by P. Kinget et al. (p. 1) https://goo.gl/cv9ssm.
"The Fundamentals of Signal Generation", Agilent Technologies, Electronic Design, Jan. 24, 2013 by Erik Diez (pp. 12) http://electronicdesign.com/test-amp-measurement/fundamentals-signal-generation.
"Microwave CMOS Beamforming Transmitters", Lund Institute of Technology, Nov. 2008 by Johan Wemehag (pp. 210) https://goo.gl/twkkTa.
"A new beam-scanning technique by controlling by coupling angle in a coupled oscillator array", Dept. of Electr. Eng., Korea Adv. Inst. of Sci. & Technol., Seoul, South Korea, IEEE Xplore, vol. 8, Issue 5, May 1998 by Jae-Ho Hwang et al. (p. 1) https://goo.gl/bPebSR.
"A mixed-signal sensor interface microinstrument", Sensors and Actuators A: Physical, Science Direct, vol. 91, Issue 3, Jul. 15, 2001 by Keith L. Kraver et al. (p. 2) http://www.siencedirect.com/science/article/pii/S0924424701005969.

\* cited by examiner

PHASE SHIFT BASED IMPROVED REFERENCE INPUT FREQUENCY SIGNAL INJECTION INTO A COUPLED VOLTAGE CONTROLLED OSCILLATOR (VCO) ARRAY DURING LOCAL OSCILLATOR (LO) SIGNAL GENERATION TO REDUCE A PHASE-STEERING REQUIREMENT DURING BEAMFORMING

CLAIM OF PRIORITY

This application is a conversion application of the U.S. provisional patent application No. 61/799,335 titled REFERENCE INPUT FREQUENCY SIGNAL INJECTION INTO COUPLED VOLTAGE CONTROLLED OSCILLATOR (VCO) ARRAYS DURING LOCAL OSCILLATOR (LO) SIGNAL GENERATION filed on Mar. 15, 2013.

FIELD OF TECHNOLOGY

This disclosure generally relates to beamforming and, more specifically, to a method, a circuit and/or a system of phase shift based improved reference input frequency signal injection into a coupled VCO array during LO signal generation to reduce a phase-steering requirement during beamforming.

BACKGROUND

A coupled Voltage Controlled Oscillator (VCO) array may be employed during Local Oscillator (LO) signal generation in a receiver (e.g., a wireless receiver) to generate differential phase shifts. The coupled VCO array may require an external reference signal injected therein to control an operating frequency thereof. Injection locking between the individual VCOs that are part of the coupled VCO array and between the VCOs and the external reference signal may limit the differential phase shift generation to a certain level, beyond which the injection locking breaks down. The phase difference between the VCOs may then become indeterminable.

SUMMARY

Disclosed are a method, a circuit and/or a system of phase shift based improved reference input frequency signal injection into a coupled VCO array during LO signal generation to reduce a phase-steering requirement during beamforming.

In one aspect, a method includes injecting a reference input signal into each VCO of a number of VCOs forming a coupled VCO array to reduce a level of injection energy required therefor compared to injecting the reference input signal at an end of the coupled VCO array. The reference input signal is configured to control operating frequency of the coupled VCO array. The method also includes utilizing a phase shift circuit: between individual VCOs of the coupled VCO array and/or in a path of injection of the reference input signal into one or more VCO(s) of the individual VCOs, and mixing outputs of the number of VCOs of the coupled VCO array with signals from antenna elements of an antenna array to introduce differential phase shifts in signal paths coupled to the antenna elements during performing beamforming with the antenna array. Further, the method includes reducing a phase-steering requirement of the coupled VCO array during the beamforming based on the utilization of the phase shift circuit.

In another aspect, a beamforming system includes a number of VCOs forming a coupled VCO array. Each VCO of the number of VCOs is configured to have a reference input signal injected therein to reduce a level of injection energy required therefor compared to injecting the reference input signal at an end of the coupled VCO array. The reference input signal is configured to control operating frequency of the coupled VCO array. The beamforming system also includes a phase shift circuit utilized: between individual VCOs of the coupled VCO array and/or in a path of injection of the reference input signal into one or more VCO(s) of the individual VCOs, and an antenna array including a number of antenna elements. Further, the beamforming system includes a number of mixers, each of which is configured to mix an output of the each VCO of the number of VCOs forming the coupled VCO array with a signal from an antenna element of the antenna array to introduce differential phase shifts in signal paths coupled to the antenna elements during performing beamforming with the antenna array. The utilization of the phase shift circuit is configured to reduce a phase-steering requirement of the coupled VCO array during the beamforming.

In yet another aspect, a wireless communication system includes a beamforming system. The beamforming system includes a number of VCOs forming a coupled VCO array. Each VCO of the number of VCOs is configured to have a reference input signal injected therein to reduce a level of injection energy required therefor compared to injecting the reference input signal at an end of the coupled VCO array. The reference input signal is configured to control operating frequency of the coupled VCO array. The beamforming system also includes a phase shift circuit utilized: between individual VCOs of the coupled VCO array and/or in a path of injection of the reference input signal into one or more VCO(s) of the individual VCOs, and an antenna array including a number of antenna elements. Further, the beamforming system includes a number of mixers, each of which is configured to mix an output of the each VCO of the number of VCOs forming the coupled VCO array with a signal from an antenna element of the antenna array to introduce differential phase shifts in signal paths coupled to the antenna elements during performing beamforming with the antenna array. The utilization of the phase shift circuit is configured to reduce a phase-steering requirement of the coupled VCO array during the beamforming.

The wireless communication system also includes a receiver channel configured to receive a combined output of the number of mixers of the beamforming system.

Other features will be apparent from the accompanying drawings and from the detailed description that follows.

BRIEF DESCRIPTION OF THE FIGURES

Example embodiments are illustrated by way of example and not limitation in the figures of the accompanying drawings, in which like references indicate similar elements and in which.

Other features of the present embodiments will be apparent from the accompanying drawings and from the disclosure that follows.

DETAILED DESCRIPTION

Example embodiments, as described below, may be used to provide a method, a circuit and/or a system of phase shift based improved reference input frequency signal injection into a coupled VCO array during LO signal generation to reduce a phase-steering requirement during beamforming. Although the present embodiments have been described with reference to specific example embodiments, it will be evident that various modifications and changes may be made to these embodiments without departing from the broader spirit and scope of the various embodiments.

Figure 1:
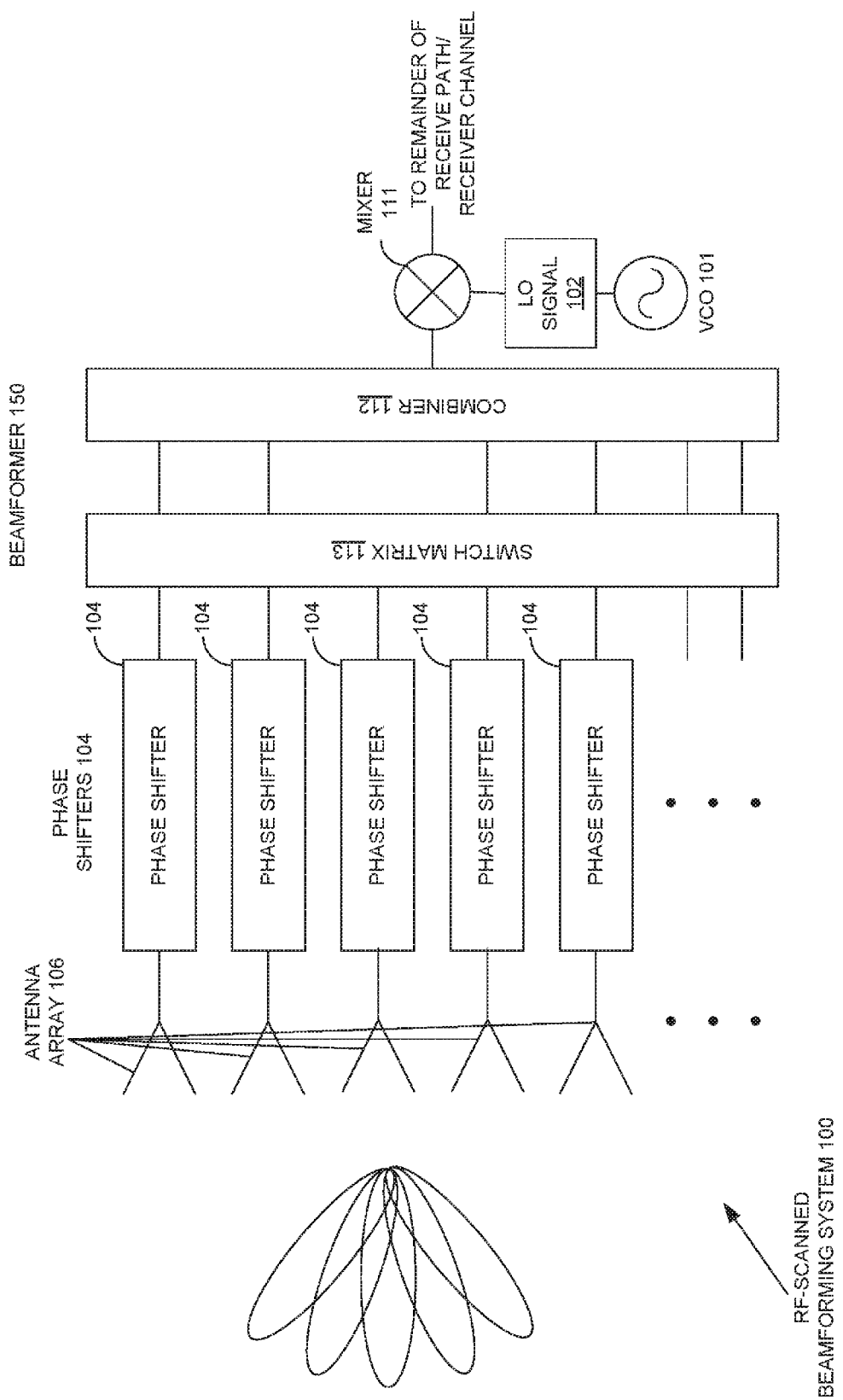
FIG. 1 is a schematic view of a Radio Frequency (RF)-scanned beamforming system.

FIG. 1 shows a Radio Frequency (RF)-scanned beamforming system 100, according to one or more embodiments. Beamforming may be a processing technique for electronically pointing fixed arrays of antenna apertures during wireless transmission and/or reception. For example, beamforming may be used to create a focused antenna beam by shifting a signal in time or in phase to provide gain of the signal in a desired direction and to attenuate the signal in other directions. Here, the arrays may be one-dimensional, two-dimensional, or three-dimensional, and the electronic pointing of an antenna array may be performed for transmission and/or reception of signals. Beamforming may be utilized to direct the energy of a signal transmitted from an antenna array and/or to concentrate the energy of a received signal into an antenna array. Electronically pointing an antenna array may be faster and more flexible than physically pointing a directional antenna.

By directing the energy from and/or concentrating the energy incoming to an antenna array, higher efficiency may be achieved when compared to implementations utilizing a standard antenna. This may result in a capability to transmit and/or receive signals correspondingly to and/or from more distant receiving and/or transmitting radios.

Figure 2:
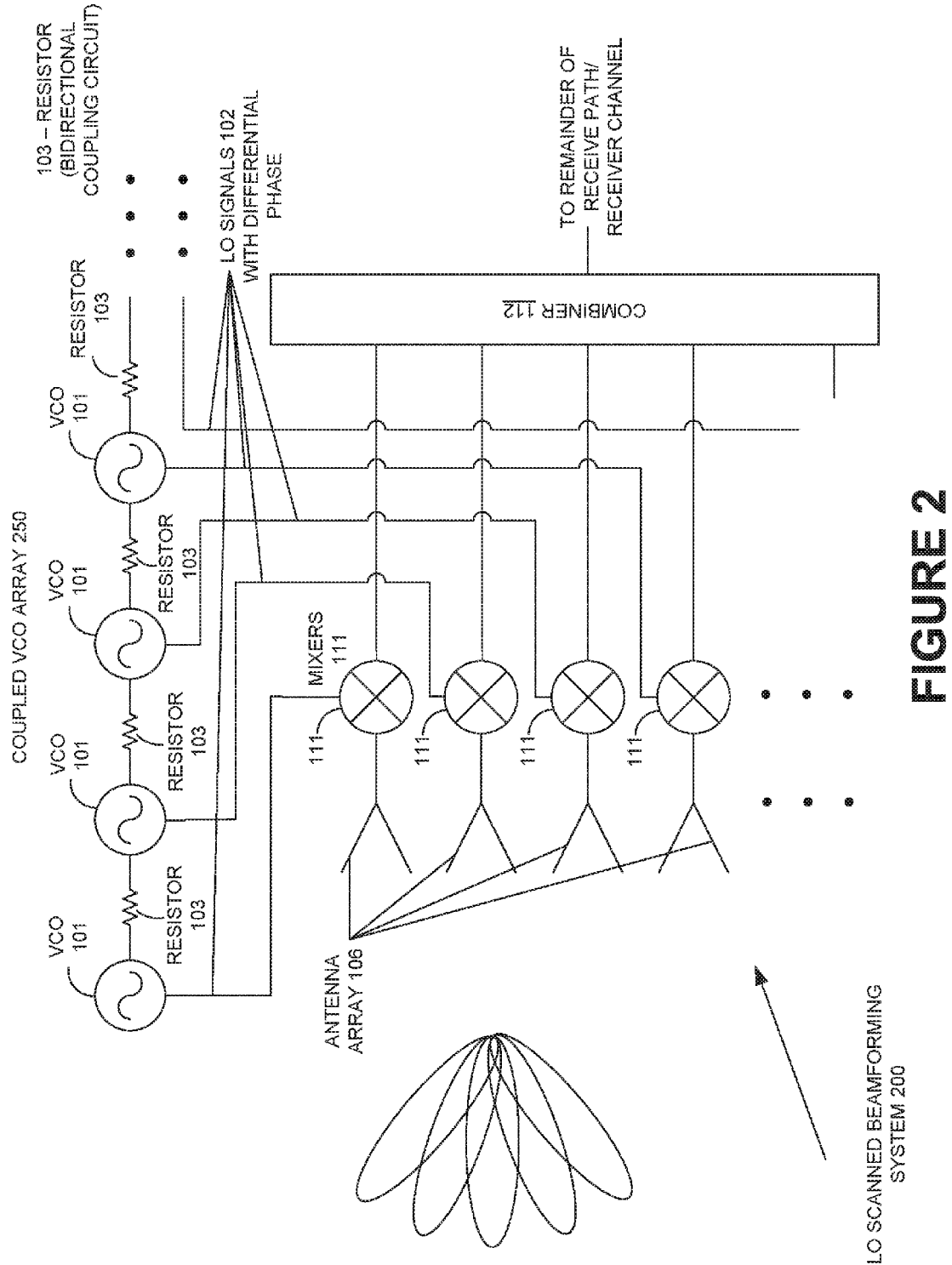
FIG. 2 is a schematic view of a Local Oscillator (LO) scanned beamforming system.

Beamforming may be commonly accomplished by introducing differential phase shifts in the signal paths connected to each of the antenna apertures (antenna elements). One conventional technique, shown in FIG. 1 (e.g., an example beamforming system such as RF-scanned beamforming system 100), may introduce the required phase shifts in the signal paths by using an RF-scanned array (e.g., including antenna array 106), in which explicit phase shifters 104 are connected directly in series with the signal paths (e.g., signal paths from antenna array 106). As shown in FIG. 2 (another example beamforming system), another conventional technique may introduce the required phase shifts in the signal paths by using a Local Oscillator (LO)-scanned array, in which LO signals 102 with differential phases are generated and the differential phase LO signals 102 input to mixers 111 (see also FIG. 1) located in the signal paths (e.g., signal paths coupled to antenna array 106).

Antenna array 106 may be utilized in beam-steering or directing and/or focusing of transmitted/received signals. By directing the energy from and/or concentrating the energy incoming thereto, a higher efficiency may be achieved compared to a standard antenna implementation. This may result in the capability to transmit and/or receive signals corresponding to and/or from more distant receiving or transmitting radios, as discussed above.

A voltage controlled oscillator (VCO) 101 (see FIGS. 1-5) may be an electronic oscillator configured to vary oscillation frequency thereof based on a voltage input. FIGS. 1-5 serve to describe the receiver (e.g., wireless receiver) context in which exemplary embodiments discussed herein may be practiced. The function of VCO 101 in LO signal generation (e.g., LO signal(s) 102 of FIGS. 1-2) as applied to receivers is well known to one of ordinary skill in the art. In order to generate differential phase LO signals, a coupled VCO array may be utilized. FIG. 2 shows an LO scanned beamforming system 200 including a coupled VCO array 250. Here, coupled VCO array 250 may include two or more VCOs 101 mutually injection locked to each other. Injection locking may be the state in which the two or more VCOs 101 exchange oscillatory energy sufficient enough to lock to a same frequency. Injection locking may be accomplished based on coupling VCOs 101 together through a bidirectional coupling circuit (e.g., resistor 103; other bidirectional circuits may also be used instead).

When a single VCO 101 is used, voltage control is utilized to vary the frequency thereof, as discussed above. In coupled VCO array 250, once the two or more VCOs 101 are injection locked to each other, the voltage control inputs (e.g., control inputs 306 shown in FIG. 3) to the two or more VCOs 101 may still be utilized to vary the frequency of coupled VCO array 250 provided that the voltage control inputs have the same voltage levels and are varied in the same manner. If the voltage levels are different, the phase of the signals generated by the individual VCOs 101 may be separated. The aforementioned phase separation between the LO signals generated by the individual VCOs in coupled VCO array 250 may be utilized to perform beamforming when the phase-separated LO signals (e.g., LO signals 102) are mixed (e.g., through mixers 111) with transmit or receive signals to or from antenna array 106. The outputs of mixers 111 may be combined at a combiner 112 (e.g., a combiner circuit).

FIG. 1 also shows beamformer 150; said beamformer 150 is shown as including a switch matrix 113 and combiner 112; switch matrix 113 may be understood to be circuitry associated with routing signals (e.g., RF signals) between multiple inputs and outputs; combiner 112, obviously, may combine the multiple outputs of switch matrix 113. Here, the outputs of phase shifters 104 may serve as the multiple inputs to switch matrix 113.

Figure 3:
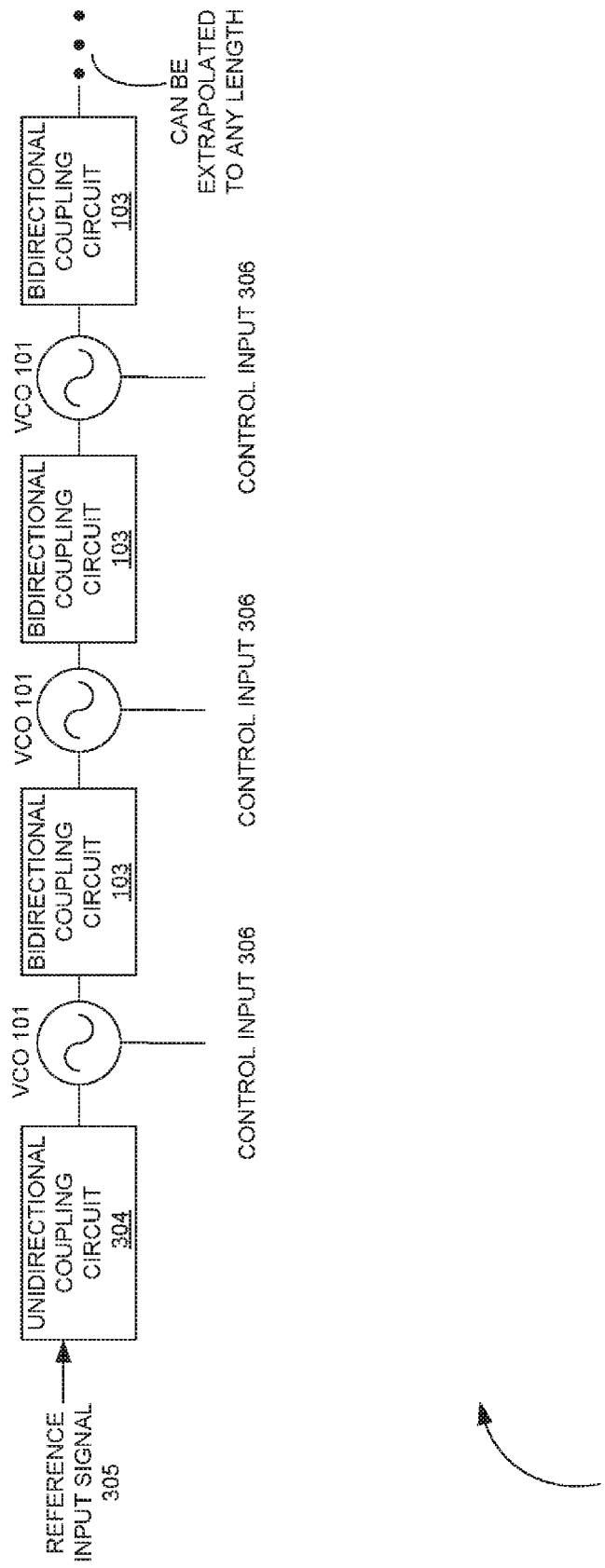
FIG. 3 is a schematic view of a coupled Voltage Controlled Oscillator (VCO) array of the LO scanned beamforming system of FIG. 2.

In FIG. 2, voltage control inputs of coupled VCO array 250 may be utilized exclusively for achieving phase separation between VCOs 101. Therefore, the voltage control inputs may be no longer available to be used for controlling the operating frequency of coupled VCO array 250. As the aforementioned operating frequency control is essential to a beamforming system, a separate reference signal may be injected into coupled VCO array 250. FIG. 3 shows coupled VCO array 250 with a reference input signal 305 thereto (e.g., shown as being coupled to VCOs 101 through unidirectional coupling circuit 304). The frequency control of reference input signal 305 may be accomplished through a system independent of coupled VCO array 250. The mechanism for injecting reference input signal 305 may also be based on injection locking. Thus, VCOs 101 of FIG. 3 may not only be mutually injection locked to each other, but also injection locked to reference input signal 305. As discussed above, control inputs 306 may be utilized to vary the frequency of coupled VCO array 250.

Coupled VCO array 250 may only generate differential phase shifts up to a certain level. Beyond this level, mutual injection locking may break down, and phase differences between VCOs 101 may be indeterminable. Thus, the range of possible LO phase differences generated through coupled VCO array 250 may be limited.

It will be appreciated that concepts disclosed herein may also be applied to two-dimensional or three-dimensional arrays of VCOs 101, in addition to one-dimensional arrays thereof. A common technique for introducing reference input signal 305 into coupled VCO array 250 may involve injecting reference input signal 305 from one end of the linear coupled VCO array 250 (see FIG. 3). Another common technique may involve injection reference input signal 305 into both ends of coupled VCO array 250. Injecting reference input signal 305 into one or both ends of coupled VCO array 250 may require a relatively high level of injection energy as VCOs 101 near the center of coupled VCO array 250 are more isolated from reference input signal 305 than VCOs 101 at ends thereof. This may especially be true in the case of coupled VCO array 250 having a large number of VCOs 101.

Figure 4:
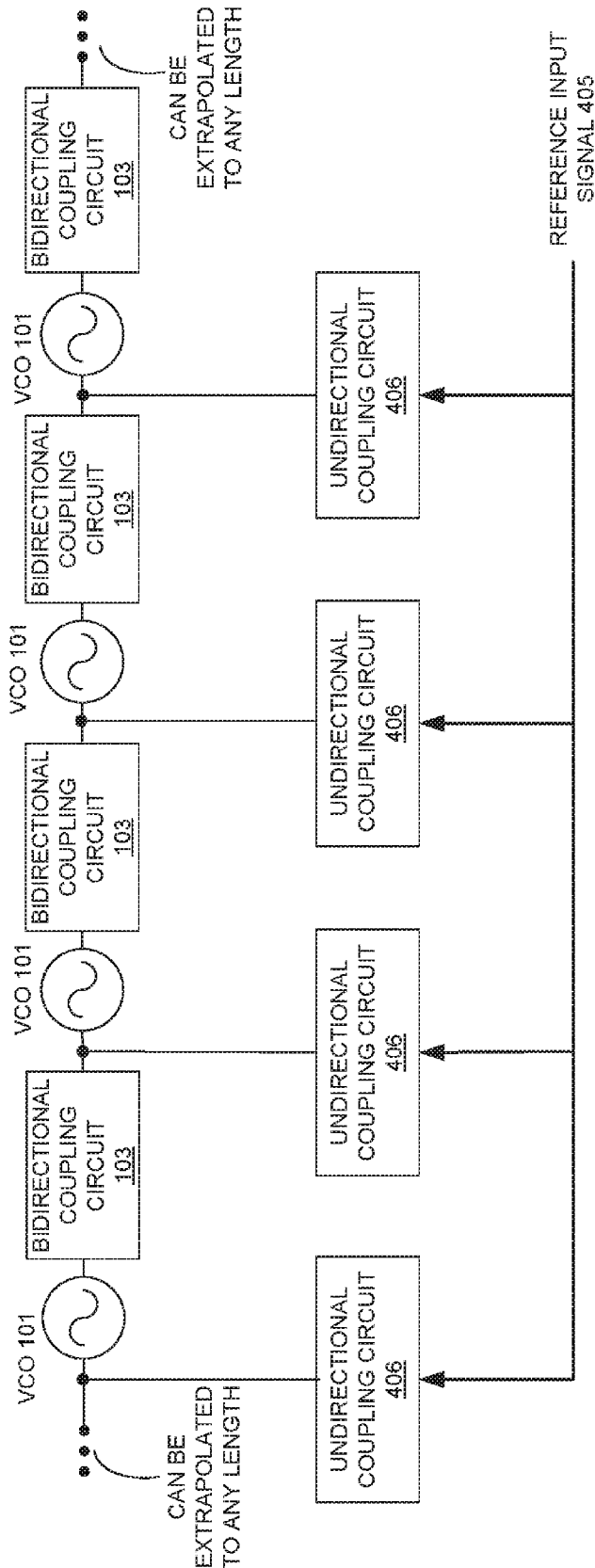
FIG. 4 is a schematic view of injection of a reference input frequency signal into each VCO of a coupled VCO array, according to one or more embodiments.

FIG. 4 shows injection of a reference input signal 405 (or, a reference frequency from an independent source) into each element (VCO 101/bidirectional coupling circuit 103) of a coupled VCO array 400 analogous to coupled VCO array 250, according to one or more embodiments. It is obvious that reference input signal 405 is analogous to reference input signal 305. In one or more embodiments, through the introduction of reference input signal 405 into each element, it may be easier for coupled VCO array 400 to achieve injection locking; this may result in lower power consumption and larger phase difference performance. Again, in one or more embodiments, reference input signal 405 may be coupled to each element through unidirectional coupling circuit(s) 406, as shown in FIG. 4.

In one or more embodiments, coupled VCO array 400 may be improved by adding switched 180-degree phase shift circuits (phase inverters) between each VCO 101 in series with bidirectional coupling circuits 103. For example, if a 190 degree phase shift is desired between adjacent VCOs 101, the phase-steering capability alone may be utilized to achieve the aforementioned 190 degree phase shift. However, if a phase inverter is inserted into the coupling path, then a phase shift of 180 degrees of the 190 degrees may already be accomplished, leaving only 10 degrees of steering required. Using phase inverters, therefore, may effectively halve the necessary phase-steering range of coupled VCO array 400. Moreover, 180 degree phase-shifting elements may be relatively easy to implement.

Figure 5:
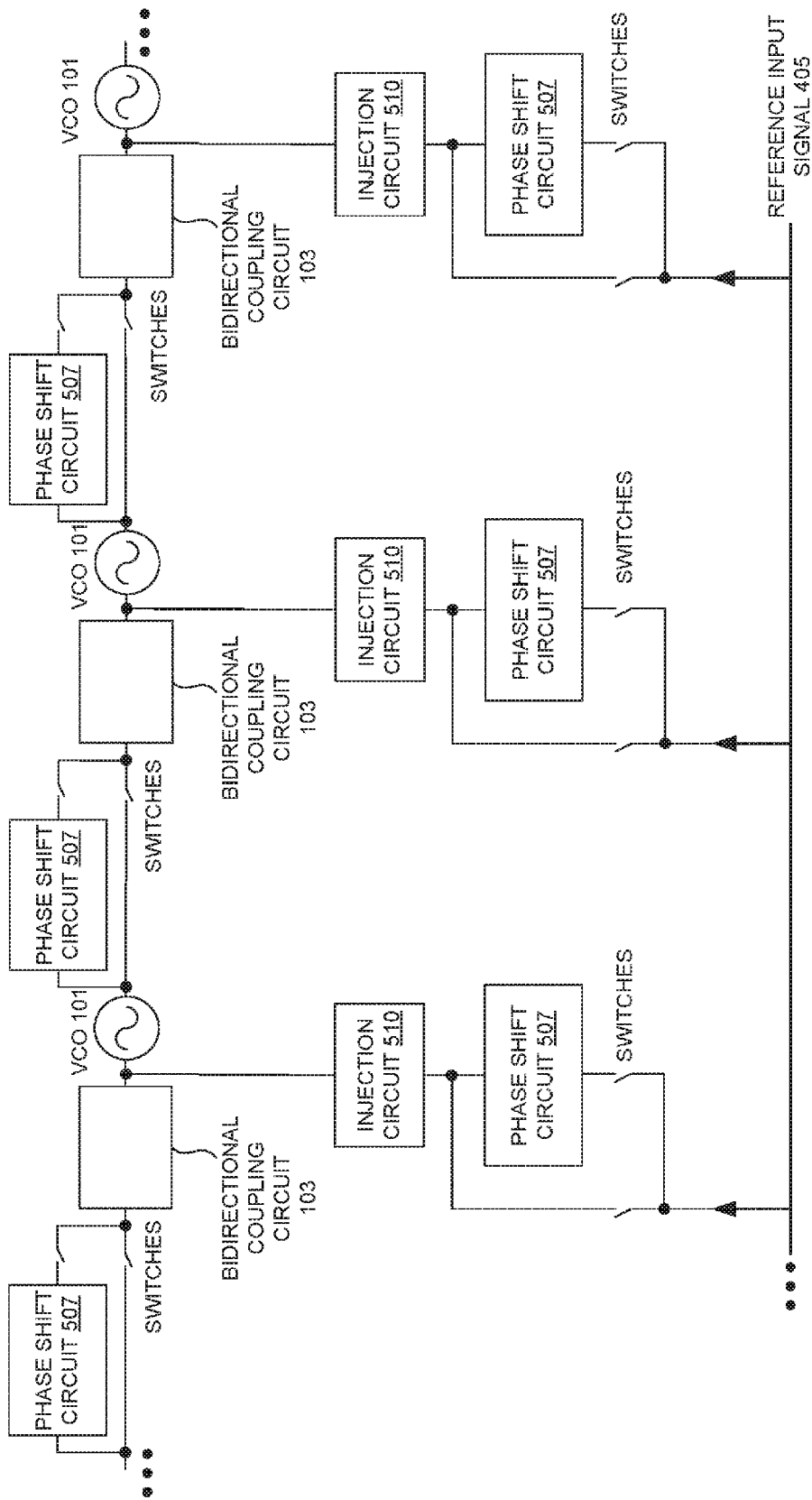
FIG. 5 is a schematic view of introducing phase shifts in injection paths of the reference input frequency signal of FIG. 4 and/or between individual VCOs of the coupled VCO array of FIG. 4, according to one or more embodiments.

In one or more embodiments, as shown in FIG. 5, coupled VCO array 400 may include a switched 180-degree phase shift circuit 507 (phase inverters) each between two VCOs 101 of coupled VCO array 400 in series with a bidirectional coupling circuit 103. Further, in one or more embodiments, similar phase shift circuits (e.g., phase shift circuits 507) may be introduced in the paths of injection of reference input signal 405. In one or more embodiments, by injecting inverted reference input signal 405 into VCOs 101 whose phase is inverted relative to adjacent VCOs 101, the injection process of reference input signal 405 may be more efficient, leading to benefits such as lower power and higher performance.

In one or more embodiments, inverted injection of reference input signal 405 may be done even when there are no inversions between VCOs 101. For example, consider coupled VCO array 400 with the controls set such that there is zero phase difference between VCOs 101. Also, assume that all injection circuits (e.g., injection circuits 510) associated with reference input signal 405 are not inverted. The aforementioned example scenario may result in a mutually injection locked coupled VCO array 400 with no phase differences, where coupled VCO array 400 is locked to reference input signal 405.

Thus, in one or more embodiments, by inverting one or more of the reference frequency injection paths, phase shifts may be introduced between adjacent VCOs 101 without exercising phase-steering controls. This may result in an extended phase difference range.

It should be noted that introduction of phase shifts is not limited to phase inversion. Non-180 degree phase shifts are also within the scope of the exemplary embodiments discussed herein. In one or more embodiments, injecting reference input signal 405 into each element of coupled VCO array 400, along with the switched-phase inversion circuitry, may provide for wider beam-forming angles at the antenna array, thereby leading to better performance and more flexibility. Also, it should be noted that the aforementioned concepts may be combined with other architectures of coupled VCO array 400.

Further, it should be noted that a length of coupled VCO array 400 (e.g., a number of VCOs 101 therein) may be extrapolated as shown in FIG. 4 based on a requirement of the beamforming discussed above. Still further, it should be noted that a combined output of mixers 111 in FIG. 2 may be input to a channel of a wireless receiver incorporating the beamforming discussed above.

Figure 6:
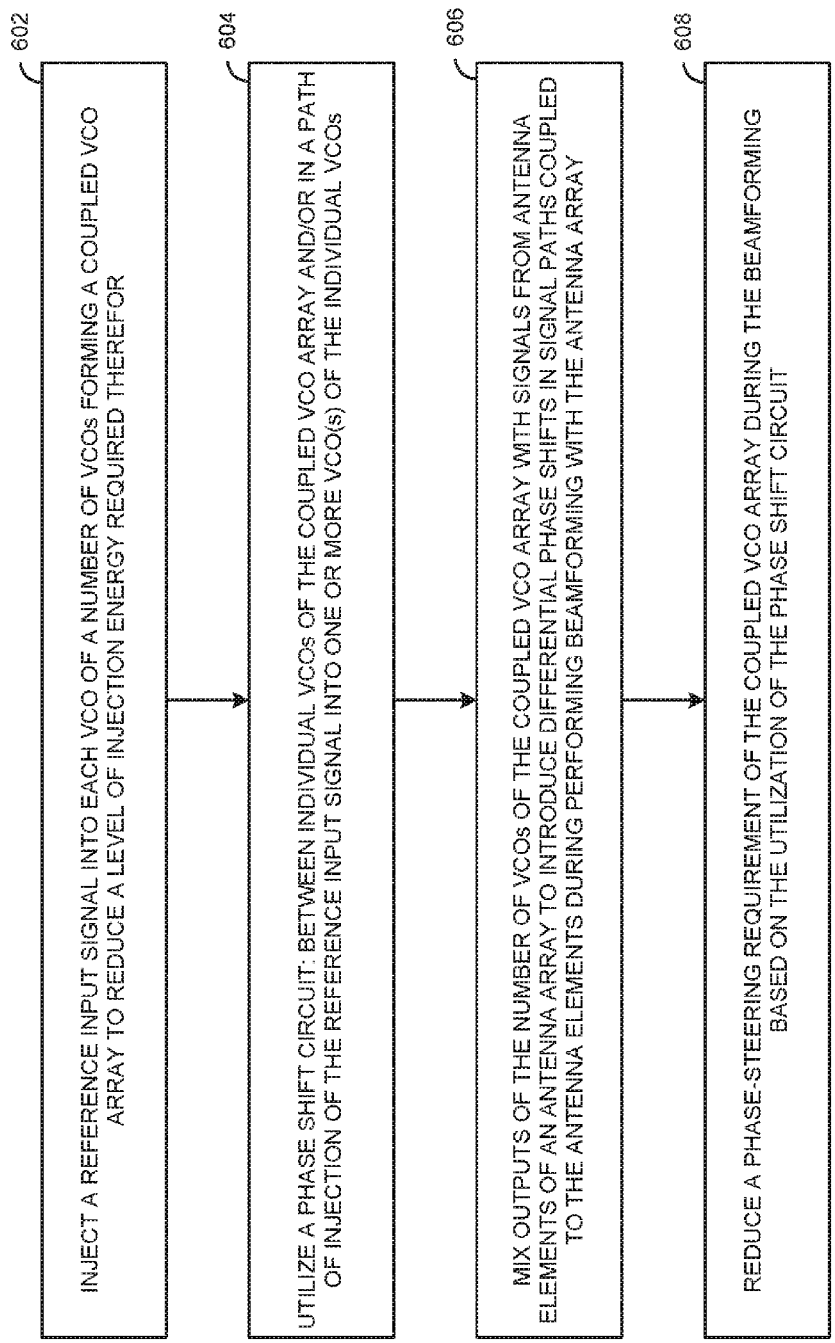
FIG. 6 is a process flow diagram detailing operations involved in phase shift based improved reference input frequency signal injection into the coupled VCO array of FIG. 4 during LO signal generation to reduce a phase-steering requirement during beamforming, according to one or more embodiments.

FIG. 6 shows a process flow diagram detailing operations involved in phase shift based improved reference input frequency signal (e.g., reference input signal 405) injection into coupled VCO array 400 during LO signal generation to reduce a phase-steering requirement during beamforming, according to one or more embodiments. In one or more embodiments, operation 602 may involve injecting reference input signal 405 into each VCO 101 of a number of VCOs 101 forming coupled VCO array 400 to reduce a level of injection energy required therefor compared to injecting reference input signal 405 at an end of coupled VCO array 400. In one or more embodiments, reference input signal 405 may be configured to control operating frequency of coupled VCO array 400. In one or more embodiments, operation 604 may involve utilizing phase shift circuit 507: between individual VCOs 101 of coupled VCO array 400 and/or in a path of injection of reference input signal 405 into one or more VCO(s) 101 of the individual VCOs 101.

In one or more embodiments, operation 606 may involve mixing outputs of the number of VCOs 101 of coupled VCO array 400 with signals from antenna elements of antenna array 106 to introduce differential phase shifts in signal paths coupled to the antenna elements during performing beamforming with antenna array 106. In one or more embodiments, operation 608 may then involve reducing a phase-steering requirement of coupled VCO array 400 during the beamforming based on the utilization of phase shift circuit 507.

Although the present embodiments have been described with reference to specific example embodiments, it will be evident that various modifications and changes may be made to these embodiments without departing from the broader spirit and scope of the various embodiments. Accordingly, the specification and drawings are to be regarded in an illustrative rather than a restrictive sense.

What is claimed is:

1. A method comprising:
    injecting a reference input signal into each Voltage Controlled Oscillator (VCO) of a plurality of VCOs forming a coupled VCO array to reduce a level of injection energy required therefor compared to injecting the reference input signal at an end of the coupled VCO array, the reference input signal being configured to control operating frequency of the coupled VCO array;
    mixing outputs of the plurality of VCOs of the coupled VCO array with signals from antenna elements of an antenna array to introduce differential phase shifts in signal paths coupled to the antenna elements during performing beamforming with the antenna array; and
    utilizing a phase shift circuit at least one of: between individual VCOs of the coupled VCO array and in a path of injection of the reference input signal into at least one VCO of the individual VCOs to reduce a phase-steering requirement of the coupled VCO array during the beamforming.

2. The method of claim 1, further comprising injection locking two or more VCOs of the coupled VCO array to each other.

3. The method of claim 2, comprising:
    coupling a VCO of the coupled VCO array to another VCO thereof through a bidirectional coupling circuit; and
    coupling the phase shift circuit in series with the bidirectional coupling circuit between the VCO and the another VCO.

4. The method of claim 1, comprising providing one of: a one-dimensional, a two-dimensional and a three-dimensional VCO array as the coupled VCO array.

5. The method of claim 1, further comprising combining outputs of the mixing at a combiner circuit as part of the beamforming.

6. The method of claim 1, comprising providing a phase inverter circuit as the phase shift circuit.

7. The method of claim 1, further comprising extrapolating a length of the coupled VCO array based on a requirement of the beamforming.

8. A beamforming system comprising:
    a plurality of VCOs forming a coupled VCO array, each VCO of the plurality of VCOs being configured to have a reference input signal injected therein to reduce a level of injection energy required therefor compared to injecting the reference input signal at an end of the coupled VCO array, and the reference input signal being configured to control operating frequency of the coupled VCO array;
    an antenna array comprising a plurality of antenna elements;
    a plurality of mixers, each of which is configured to mix an output of the each VCO of the plurality of VCOs forming the coupled VCO array with a signal from an antenna element of the antenna array to introduce differential phase shifts in signal paths coupled to the antenna elements during performing beamforming with the antenna array; and
    a phase shift circuit utilized at least one of: between individual VCOs of the coupled VCO array and in a path of injection of the reference input signal into at least one VCO of the individual VCOs to reduce a phase-steering requirement of the coupled VCO array during the beamforming.

9. The beamforming system of claim 8, wherein two or more VCOs of the coupled VCO array are injection locked to each other.

10. The beamforming system of claim 9, wherein:
    a VCO of the coupled VCO array is configured to be coupled to another VCO thereof through a bidirectional coupling circuit, and
    the phase shift circuit is configured to be coupled in series with the bidirectional coupling circuit between the VCO and the another VCO.

11. The beamforming system of claim 8, wherein the coupled VCO array is one of: a one-dimensional, a two-dimensional and a three-dimensional VCO array.

12. The beamforming system of claim 8, further comprising a combiner circuit to combine outputs of the plurality of mixers as part of the beamforming.

13. The beamforming system of claim 8, wherein the phase shift circuit is a phase inverter circuit.

14. The beamforming system of claim 8, wherein a length of the coupled VCO array is configured to be extrapolated based on a requirement of the beamforming.

15. A wireless communication system comprising:
    a beamforming system comprising:
        a plurality of VCOs forming a coupled VCO array, each VCO of the plurality of VCOs being configured to have a reference input signal injected therein to reduce a level of injection energy required therefor compared to injecting the reference input signal at an end of the coupled VCO array, and the reference input signal being configured to control operating frequency of the coupled VCO array;
        an antenna array comprising a plurality of antenna elements;
        a plurality of mixers, each of which is configured to mix an output of the each VCO of the plurality of VCOs forming the coupled VCO array with a signal from an antenna element of the antenna array to introduce differential phase shifts in signal paths coupled to the antenna elements during performing beamforming with the antenna array; and
        a phase shift circuit utilized at least one of: between individual VCOs of the coupled VCO array and in a path of injection of the reference input signal into at least one VCO of the individual VCOs to reduce a phase-steering requirement of the coupled VCO array during the beamforming; and
    a receiver channel configured to receive a combined output of the plurality of mixers of the beamforming system.

16. The wireless communication system of claim 15, wherein two or more VCOs of the coupled VCO array of the beamforming system are injection locked to each other.

17. The wireless communication system of claim 16, wherein:
    a VCO of the coupled VCO array of the beamforming system is configured to be coupled to another VCO thereof through a bidirectional coupling circuit, and
    the phase shift circuit is configured to be coupled in series with the bidirectional coupling circuit between the VCO and the another VCO.

18. The wireless communication system of claim 15, wherein the coupled VCO array of the beamforming system is one of: a one-dimensional, a two-dimensional and a three-dimensional VCO array.

19. The wireless communication system of claim 15, wherein the phase shift circuit of the beamforming system is a phase inverter circuit.

20. The wireless communication system of claim 15, wherein a length of the coupled VCO array of the beamforming system is configured to be extrapolated based on a requirement of the beamforming.

\* \* \* \* \*